United States Patent
Ciccone et al.

[19]

[11] Patent Number: 5,959,478
[45] Date of Patent: Sep. 28, 1999

[54] PHASE-LOCKED LOOP HAVING IMPROVED LOCKING TIMES AND A METHOD OF OPERATION THEREFORE

[75] Inventors: John Charles Ciccone, Scottsdale; Stephen D. Nemetz, Gilbert, both of Ariz.

[73] Assignee: VLSI Technology, Inc., San Jose, Calif.

[21] Appl. No.: 08/962,466

[22] Filed: Oct. 31, 1997

[51] Int. Cl.$^6$ ...................................................... H03L 7/00
[52] U.S. Cl. ............................. 327/157; 327/159; 331/16
[58] Field of Search .................................. 327/147, 148, 327/156, 157, 159; 331/16, 17, 14, 15

[56] References Cited

U.S. PATENT DOCUMENTS

| | | | |
|---|---|---|---|
| 5,170,130 | 12/1992 | Ichihara | 331/17 |
| 5,220,294 | 6/1993 | Ichikawa | 331/17 |
| 5,347,233 | 9/1994 | Ishibashi et al. | 331/2 |
| 5,534,823 | 7/1996 | Kondou | 331/16 |
| 5,677,648 | 10/1997 | Jones | 331/17 |

*Primary Examiner*—Tuan T. Lam

[57] ABSTRACT

An electronic device is delineated comprising, in combination, a Phased Lock Loop (PLL) having a charge pump, and a mixed signal circuit coupled in parallel to the charge pump. The mixed signal circuit includes analog circuitry for adding charge to and removing charge from capacitors in a Low Pass Filer (LPF) of the PLL. The mixed signal circuit also includes digital circuitry for controlling the initiation and termination of both the charging and discharging operations carried on by the analog portion of the mixed signal circuit. Upon a significant change in system frequency, the mixed signal circuit first fully discharges and then rapidly charges the capacitors in the LPF in a manner which results in a significant reduction in PLL locking time.

16 Claims, 2 Drawing Sheets ized by those skilled in the electrical arts, the present invention relates to, but is not limited by, all PLL based systems and methods.

PHASE-LOCKED LOOP HAVING IMPROVED LOCKING TIMES AND A METHOD OF OPERATION THEREFORE

BACKGROUND OF THE INVENTION

1. Field of the Invention

This invention is in the field of Phase-Locked Loops (hereafter "PLLs") and methods of operation therefore and, more particularly, is a Phase-Locked Loop (hereafter "PLL") having improved locking times and a method of operation therefore.

2. Description of the Related Art

Phase-locked loops are well known to those skilled in the art of electrical engineering. In its most basic form, a PLL is simply a closed loop feedback system designed to drive the feedback signal to match the input reference signal in both phase and frequency. Typically, a system incorporating a PLL uses the PLL to generate a signal of a desired frequency for use by the system. In particular, the reference signal input to the PLL is changed in frequency and/or phase, and in response, the PLL drives the feedback signal to match the input reference signal in phase and frequency. Once matched, the feedback signal can be used by the system.

While the feedback signal is transient (i.e., from the time that the reference signal input changes until the feedback signal has approximately reached the reference signal in phase and frequency), a charge pump of the PLL either adds or removes charge from capacitors in a Low Pass Filter (hereafter "LPF"). The potential output from the LPF is input to a Voltage Controlled Oscillator (hereafter "VCO") who's output signal provides via a scaling factor, if necessary, the feedback signal. Generally, the frequency of the output signal from the VCO is proportional to the VCO's input voltage. Accordingly, the quicker that the PLL is able to charge, or discharge as the case may require, the capacitors in the LPF to the potential corresponding to the desired frequency for the feedback signal, the shorter, and therefore better, the locking time will be for the PLL. The term, "locking time," refers to the time required for the feedback signal to reach the frequency and phase of the input reference signal after a change in the input reference signal.

Shorter locking times are generally desirable for PLLs. However, due to the inherent nature of one of the PLL's components, locking times are unfortunately, relatively long. More specifically, a modern day PLL includes a Phase Frequency Detector (hereafter "PFD"). The operation of a standard PFD, which like all of the aforementioned components in a standard PLL, is well known to those skilled in the art, and it causes unnecessarily long locking times for the PLL.

To facilitate a better understanding of this proposition, one must first understand the general operating characteristics of a PFD within a PLL. In particular, a PFD has as inputs the reference and feedback signals. The PFD compares these signals in order to determine if the feedback signal is running slower, faster, or at the same frequency and phase as the reference signal. If the feedback signal is running slower, the PFD asserts a signal generally referred to as an UP signal, which via PLL operation, ultimately results in the feedback signal speeding up. Assertion of the UP signal causes the charge pump to add charge to the capacitors in the LPF, thereby speeding up the feedback signal. Conversely, if the feedback signal is running faster than the reference signal, the PFD asserts a signal generally referred to as a DOWN (sometimes abbreviated as DWN) signal, which via PLL operation, ultimately results in the feedback signal slowing down. Assertion of the DWN signal causes the charge pump to remove charge from the capacitors in the LPF, and this results in slowing the feedback signal. Lastly, when the reference and feedback signals are monitored in phase and frequency, the PLL is locked, so both the UP and DWN signals are de-asserted, causing the charge pump to neither add nor remove charge from the LPF, thereby not changing the feedback signal.

Now, in light of the foregoing discussion, it should be apparent that anything that slows the process of charging, or discharging as the case may be, the capacitors in the LPF causes increased locking times for the PLL. The PFD, due to its inherent operational nature, slows the charging of the LPF capacitors in the case where the feedback signal is running slow. In order to explain, assume that the feedback signal is running slower than the reference signal, which means that a given rising edge of the reference signal will be detected by the PFD before a corresponding rising edge for the feedback signal. When the reference signal's rising edge is detected, the PFD will assert its UP signal causing more charge to be added to the LPF's capacitors, and the frequency of the feedback signal to rise—the desired effect. Soon thereafter though, a rising edge of the lagging feedback signal will be detected, and at this point, the PFD asserts the DOWN signal, but for only a short time since the PFD resets itself (i.e., de-asserts both the UP and DOWN signals) when both have been asserted. Thus, when the DWN signal de-asserts, the UP signal also will de-assert per the standard operation of a PFD. Of course, when the UP signal is de-asserted, the addition of charge to the LPF's capacitors from the charge pump will be interrupted until the UP signal is again asserted by the detection of the next rising edge of the reference signal by the PFD. This interruption of charging to the LPF results in longer locking times for the PLL; however, due to the intrinsic operational characteristics of the PFD, it is unavoidable.

Therefore, there existed a need to provide a PLL having supplemental charging and discharging circuitry for improving PLL locking times and a method of operation therefore.

SUMMARY OF THE INVENTION

An object of the present invention is to provide a PLL having improved locking times and a method of operation therefore.

Another object of the present invention is to provide a PLL including supplemental charging and discharging circuitry for improving PLL locking times and a method of operation therefore.

A further object of the present invention is to provide an improved PLL and a method of operation therefore which, when a significant change is required of the PLL's output frequency, discharges and then rapidly charges the PLL's LPF capacitors.

BRIEF DESCRIPTION OF THE PREFERRED EMBODIMENTS

According to one embodiment of the present invention, an electronic device is disclosed comprising, in combination, a PLL having a charge pump, and a mixed signal circuit coupled in parallel to the charge pump. The mixed signal circuit includes an inverter having a RESET signal input wherein the RESET signal comprises a RESET signal for the PLL, and the inverter also has an output to a pair of MOS transistors. More particularly, the output from the inverter is coupled to a gate junction of each transistor of the pair of MOS transistors. A drain junction of one transistor of the pair of MOS transistors is coupled to a first capacitor in a LPF of the PLL, and a drain junction of another transistor of the pair of MOS transistors is coupled to a second capacitor in the LPF.

The mixed signal circuit further includes a latch having the RESET signal input which comprises a RESET signal for the PLL. Additionally, the mixed signal circuit includes a NAND gate which is coupled to an output of the latch. A pair of serially-connected inverters are connected between the output of the latch and an input of the NAND gate, and the NAND gate has an input providing the RESET signal. The mixed signal circuit further includes a first MOS transistor having a control input coupled to an output of the NAND gate. Also included is a second MOS transistor, which is serially-connected with the first MOS transistor, and which has an output coupled to a first node wherein the first node corresponds to an input junction of the first capacitor of the LPF. The mixed signal circuit further includes a transmission gate coupled between the first node and a second node corresponding to an input junction of the second capacitor of the LPF. A delayed version of the signal output from the latch is input to the transmission gate.

The mixed signal circuit also includes a digital filter having an output coupled as an input to the latch. More specifically, the digital filter includes a NAND gate having its output coupled as an input to the latch. This NAND gate has a plurality of inputs including a first input providing a signal UP from a PFD of the PLL, a second input providing a delayed version of the UP signal, and a third input providing an inverted version of a signal DOWN (or DWN) from the PFD. The digital filter includes at least one inverter between the UP signal and the delayed version thereof supplied to the second input. Note also that a control input of the second MOS transistor is provided with the UP signal from the PFD of the PLL.

According to another embodiment of the present invention, an electronic device is disclosed comprising, in combination, a PLL having a charge pump, and means coupled in parallel to the charge pump for discharging and then rapidly charging capacitors in a LPF of the PLL. In this second embodiment of the present invention, means are further included for terminating the rapid charging of the capacitors when they reach a certain potential.

In yet another embodiment of the present invention, a method for changing a steady-state operational frequency and rapidly attaining a new steady-state operational frequency for a PLL is disclosed comprising the steps of discharging capacitors of a LPF of the PLL in response to detection of an assertion of a RESET signal for the PLL, turning on a transmission gate in order to permit rapid charging of each capacitor in the LPF, after the step of discharging, and charging the capacitors, free from any interruption in charging caused by a DOWN signal coming from a PFD in the PLL, until the capacitors attain a potential substantially corresponding to the new steady-state operational frequency. This method further comprises the steps of monitoring each of an inverted version of the DOWN signal, an UP signal from the PFD, and a delayed version of the UP signal, and terminating the step of charging when the inverted version of the DOWN signal, the UP signal, and the delayed version of the UP signal are all at a high logic level.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
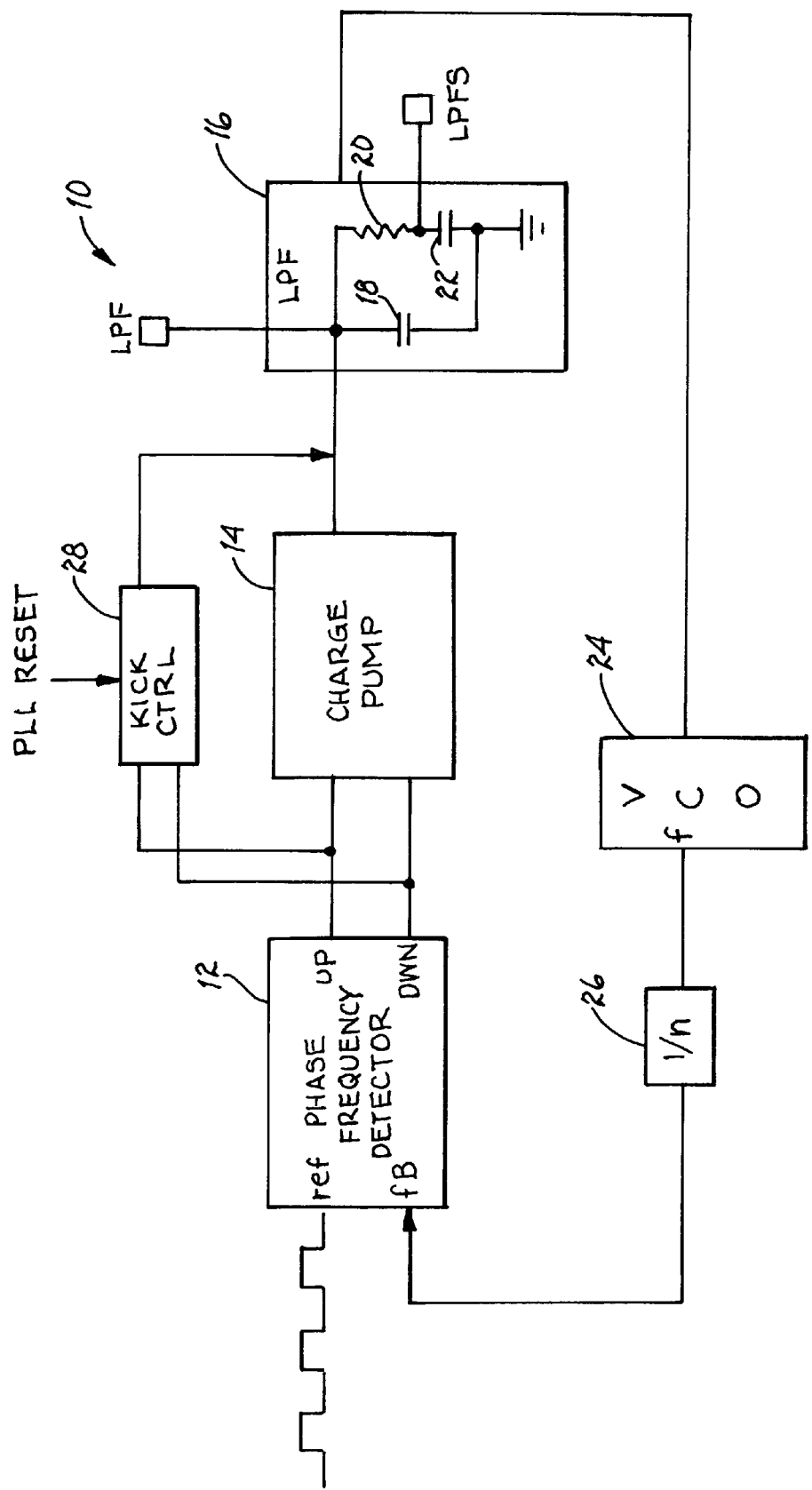
FIG. 1 is a simplified electrical block diagram of an improved PLL including supplemental charging and discharging circuitry.

Referring to FIG. 1, an improved PLL including supplemental charging and discharging circuitry is shown and generally designated by reference number 10. The charging and discharging circuitry is alternatively referred to as the kick control circuitry 28 (or more simply "kick control"). The remainder of the PLL in 10 is simply a standard PLL which is well known to those skilled in the art. In particular, a standard PLL includes a PFD 12, a charge pump 14, a LPF 16, a VCO 24, and a scaling factor 26. The particulars of construction and operation of the standard PLL (such as shown in 10 without kick control 28) will not be discussed here, as such information is readily understood by those skilled in the art. However, the addition of the kick control 28 in parallel to the charge pump 14 of the PLL is new, and therefore will be discussed in detail with respect to FIG. 2. One last point of interest with respect to FIG. 1 is that the LPF 16 includes a pair of capacitors 18 and 22 with a resistor 20 in-between.

Figure 2:
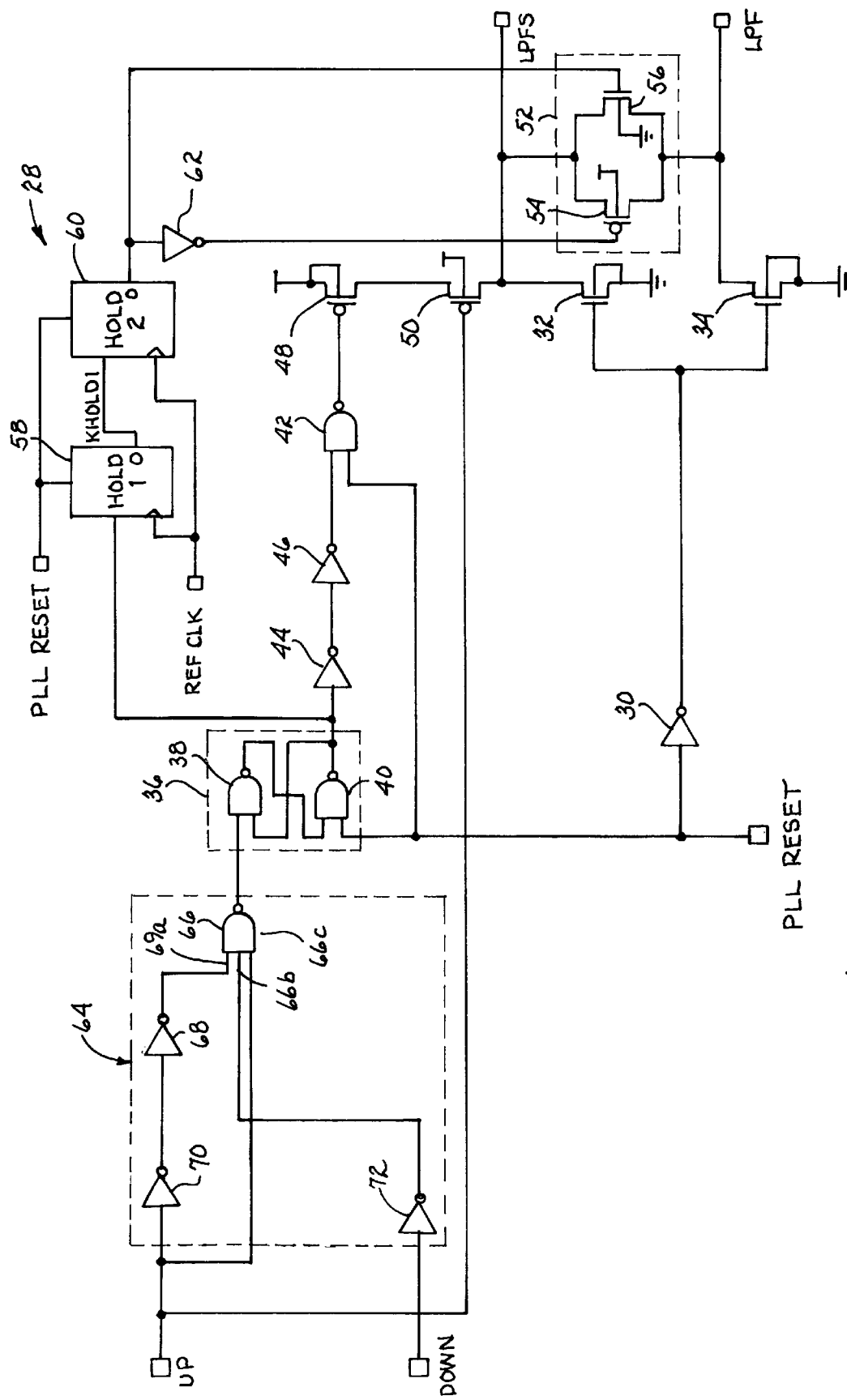
FIG. 2 is a simplified electrical schematic diagram of the supplemental charging and discharging circuitry of FIG. 1.

Referring to FIG. 2 a simplified electrical schematic diagram is shown of the supplemental charging and discharging circuitry 28 (or more simply the kick control) of FIG. 1. With reference to FIGS. 1 and 2, note that the kick control 28 has 3 separate inputs, namely the UP and DOWN (abbreviated DWN) signals from the PLL's PFD 12, and the RESET signal, which is merely the PLL's RESET signal. In FIG. 1, the kick control 28 is shown with a single line output running to a line between the charge pump 14 and the LPF 16; this is, in reality, a simplification. In particular, FIG. 2 shows that the kick control 28 has two output lines, located at the lower right corner of the Figure, and the two lines are labelled LPFS and LPF. These two output lines are represented by the simplified, single line output from kick control 28 shown in FIG. 1. The output line labelled LPFS is intended to be connected (although not shown) to the node between resistor 20 and capacitor 22 shown in FIG. 1, while the output line labelled LPF is intended to be connected (although also not shown) to the node between resistor 20 and capacitor 18. The significance of this type of connection will be discussed later.

Again with reference to FIG. 1, the electronic device 10 comprises, in combination, a PLL having a charge pump 14, and a mixed signal circuit (i.e., the kick control 28) coupled in parallel to the charge pump 14. The term "mixed signal circuit" is understood by those skilled in the art to mean a circuit including both digital and analog signals and components for processing these signals. Those skilled in the art, upon reviewing FIG. 2, recognize that there are both digital and analog signals and components, and therefore they will not be explicitly delineated here.

Now shifting focus to FIG. 2, the mixed signal circuit 28 (hereafter more simply referred to as the "kick control") includes an inverter 30 having a RESET signal input, and the RESET signal comprises a RESET signal for the PLL. The inverter 30 also has an output to a pair of MOS transistors 32 and 34. Here, transistors 32 and 34 are NMOS transistors. The output from inverter 30 is coupled to a gate junction of each transistor of the pair of MOS transistors 32 and 34.

Additionally, a drain junction of transistor 32 is coupled to a first capacitor (i.e., to the node between resistor 20 and capacitor 22) in the LPF 16. On the other hand, a drain junction of transistor 34 is coupled to a second capacitor (i.e., to the node between resistor 20 and capacitor 18) in the LPF 16.

Still with reference to FIG. 2, the kick control 28 also includes a latch 36 having the RESET signal as an input, and the RESET signal comprises the RESET signal for the PLL. Note that the latch 36 is preferably an RS-type latch well known to those skilled in the art; however, it may be possible to incorporate other well known latches, in lieu of the RS-type shown. The RS latch includes two NAND gates 38 and 40 connected as shown in FIG. 2. The kick control 28 further includes a NAND gate 42 which is coupled to the output of latch 36 (i.e., the output of NAND gate 40). More specifically, a pair of serially-connected inverters 44 and 46 are connected between an output of the latch 36 and an input of NAND gate 42. Additionally, NAND gate 42 has an input providing the RESET signal.

Again referring to FIG. 2, the kick control 28 includes a first MOS transistor 48 having a control input coupled to the output of the NAND gate 42. A second MOS transistor 50 is also included, which is serially-connected with the first MOS transistor 48, and the second MOS transistor 50 has an output coupled to a first node which corresponds to an input junction (i.e., to the node between resistor 20 and capacitor 22) of a first capacitor 22 of the LPF 16. Note that transistors 48 and 50 are PMOS type transistors. Also, note that the second MOS transistor 50 is provided, at its gate input junction, with an UP signal from PFD 12. A transmission gate 52 is also included coupled between the first node and a second node corresponding to an input junction (i.e., to the node between resistor 20 and capacitor 18) of a second capacitor 18 of the LPF 16. Note that transmission gates, like transmission gate 52, are well known to those skilled in the art, and transmission gate 52 comprises MOS transistors 54 and 56. Transistor 54 is a PMOS type device, while transistor 56 is an NMOS type device. Also, note that a delayed version of the output signal from latch 36 is input to the transmission gate 52. More specifically, a delayed version of the output signal from latch 36 is input to the gate junction of NMOS transistor 56, while a delayed, and inverted, version of the output signal from latch 36 is input to the gate junction of PMOS transistor 54. The delay of the output signal form latch 36 is accomplished via two D-type flip flops 58 and 60; however, those skilled in the art recognize that other equivalent delaying elements could be implemented, if desired. Also, note that inverter 62 is coupled between the output of flip flop 60 and the input to PMOS transistor 54.

Still referring to FIG. 2, the kick control 28 also includes a digital filter 64 having an output coupled as an input to latch 36 (i.e., to an input of NAND gate 38). Digital filter 64 includes a NAND gate 66 having its output coupled as an input to NAND gate 38 of latch 36. Note that NAND gate 66 has a plurality of inputs 66a–c including a first input 66c providing a signal UP from the PFD 12 of the PLL, a second input 66a providing a delayed version of the UP signal, and a third input 66b providing an inverted version of a signal DOWN from the PFD 12. The digital filter 64 includes at least one inverter between the UP signal and the delayed version thereof supplied to the second input 66a. Note that in the preferred embodiment, two inverters 68 and 70 located in-between the UP signal and the second input 66a establish the desired delay; however, those skilled in the art realize that other equivalent manners of establishing the same or similar delay could be implemented, if desired. Additionally, note that an inverter 72 is provided in-between the DOWN signal and the third input 66b to NAND gate 66.

OPERATION

Normally, the improved PLL 10 of FIG. 1 will operate like any other PLL under steady-state condition. That is to say, under steady-state operation of PLL 10, it performs just like any other PLL, and therefore since that type of operation is understood by those skilled in the art, it will not be discussed here. The difference in operation between a prior PLL and the improved PLL 10 becomes apparent during a transition of the system operating frequency. In other words, assume that the PLL 10 is operating at a first frequency (i.e., the feedback signal is at this first frequency), then the system for some reason requires a second faster or slower frequency—this is a transient situation. In this case, the improved PLL 10 of FIG. 1 operates much better than a prior PLL in that PLL 10 will have an improved (i.e. reduced duration) locking time, which is the time for the feedback signal of the PLL 10 to approximately equal the reference signal's frequency and phase.

Turning now to the detailed description of the operation of the kick control 28, assume that a system (not shown, but which is external to the improved PLL 10) is operating at a first frequency, and further assume that PLL 10 has already attained that frequency so it is in steady-state operation. In the preferred embodiment of the invention, the input signals UP, DOWN, and RESET are active low signals (i.e., when asserted, these signals are at a low logic level, and when de-asserted, these signals are at a high logic level). Note however, that those skilled in the art realize that PLL 10 could be implemented using active high logic for its input signals, and that the PLL 10's component circuitry would be adjusted in a manner well known to those skilled in the art to operate substantially identically to the manner discussed herein. Now, in steady-state operation, the RESET signal will be de-asserted, so that the input to inverter 30 will be high. Thus, the input to transistors 32 and 34 will be low, and therefore these transistors will be off, thereby preventing the discharge of capacitors 18 and 22 through transistors 32 and 34. Additionally, the de-asserted high RESET signal goes to an input of NAND gate 40 in the latch 36. This will, per the standard operation of an RS latch like latch 36, hold the output of NAND gate 40 low until the RESET signal is asserted. Accordingly, the input to NAND gate 42 from inverter 46 will also be low, thereby providing a high input to transistor 48 to keep it off. This prevents the charging of capacitors 18 and 22 from the kick control 28. Moreover, a low output from NAND gate 40 means that the transmission gate 52 is off. The UP and DOWN signals will assert and de-assert per the standard operation of a PFD like PFD 12; however, they will have no effect on kick control 28 until the RESET signal has been asserted.

In order to explain transient operation, consider the following hypothetical in which the system is operating a first frequency, and then a second faster frequency is required by the system (not shown, but which is located external to PLL 10). Note that the following description of the operation of PLL 10 would be the same if the new desired frequency were slower than the initial operating frequency. In order to initiate the process creating the new feedback signal frequency for the PLL 10, an external system will cause the PLL's RESET signal to assert, low in this case. In response, inverter 30 sends a high signal to the input gates of transistors 32 and 34, and they will turn on and quickly and fully discharge capacitors 18 and 22 to ground. Meanwhile the asserted low RESET signal input to NAND gate 40 causes its output to go, and remain for some time, high. The double inversion of NAND gate 40's output via inverters 44 and 46 will supply a high signal to NAND gate 42. Additionally, assertion of the RESET signal will cause the D flip flops 58 and 60 to output a low signal, thereby keeping the transistors 54 and 56 of the transmission gate 52 off.

Shortly thereafter, the RESET signal will de-assert high, causing the discharging of capacitors 18 and 22 via transistors 32 and 34 to cease since the output of inverter 30 goes low; however, at this point capacitors 18 and 22 should be fully discharged to ground. Also, de-assertion of the RESET signal permits D flip flops 58 to pass its input from the output of NAND gate 40, which has already gone high, to D flip flop 60. Flip flops 58 and 60 operate in a manner well known to those skilled in the art to pass the data at their respective inputs to their respective outputs upon detection of a rising edge on their respective reference clock inputs. Accordingly, after de-assertion of the RESET signal followed by the detection of two rising edges on the reference clock inputs of the flip flops 58 and 60, the high input from the output of NAND gate 40 will have reached the transmission gate 52. More specifically, after the two clock delay, the high signal from the output of NAND gate 40 will be applied to the gate junction of transistor 56. Also, this high signal coming from the output of D flip flop 60 is inverted to a low signal coming out of inverter 62, and it goes into the gate junction of transistor 54. Therefore, after de-assertion of the RESET signal followed by the two clock delay of the output from the NAND gate 40, the transmission gate 52 turns on.

This effectively shorts output nodes labelled LPFS and LPF together, thereby ensuring that the two capacitors 18 and 22 will be charged simultaneously and equally because the resistor 20 is bypassed during the charge. If such simultaneous and equal charging of the capacitors 18 and 22 was not accomplished via the transmission gate 52 being on, the capacitors 18 and 22 could be unequally charged, thereby resulting in undesirable cross-capacitor leakage. In other words, the capacitors 18 and 22, if unequally charged, would discharge from the higher potential of the two to the capacitor of lower potential through resistor 20. Also, by shorting the two nodes LPFS and LPF together by activating the transmission gate 52, no charging current is wasted by voltage drop across resistor 20, thereby more quickly reaching the desired charge in the LPF 16 corresponding to the desired output frequency for PLL 10.

Reviewing, at this point the capacitors 18 and 22 have been fully discharged, the discharging path through transistors 32 and 34 has been closed, the output of NAND gate 40 has been set high, and the transmission gate 52 has been turned on, thereby shorting output nodes LPFS and LPF together in order to permit rapid, simultaneous and equal charging of capacitors 18 and 22 without any charging loss through resistor 20. Also, recall that at this point the RESET signal has de-asserted high, so its input to NAND gate 42 is high, and the other input to NAND gate 42 from inverter 46 is also high. Accordingly, NAND gate 42 outputs a low signal to the gate junction of transistor 48, thereby turning it on to permit rapid charging of capacitors 18 and 22 through the transmission gate 52. The charging flow path to the capacitors 18 and 22 from the kick control circuit 28 runs from transistor 48, through transistor 50, and the transmission gate 52 to the capacitors 18 and 22.

Note that the charging pump 14 still charges the LPF 16 as it normally does in a prior PLL; however, the amount of charging current supplied from the charging pump 14 is small in comparison to that delivered by the kick control circuit 28. In reality then, there is dual charging of the capacitors 18 and 22, namely, charging from the charging pump 14 as normally accomplished, and rapid charging from the kick control circuit 28 over the path identified at the end of the preceding paragraph. Note that the kick control charging flow path includes transistor 50, which has a controlling gate input connected to the UP signal coming from the PFD 12. Thus, when the UP signal is asserted low, the kick control charging path sends current to capacitors 18 and 22; however, when the UP signal is de-asserted high, the kick control charging path will be interrupted since transistor 50 will be off. This does not undesirably inhibit the charging of capacitors 18 and 22, but rather it provides a rapid, yet controlled charge to the capacitors 18 and 22.

More specifically, note that since the capacitors 18 and 22 are fully discharged initially, the feedback signal will be running significantly slower than the reference signal input to the PFD 12. This means that the UP signal will be asserted a relatively a large amount of time during the initial charging of the LPF 16, as compared to the amount of time that the DOWN signal will be asserted. Recall however, that per the standard operation of the PFD 12, the DOWN signal will be asserted each time that a rising edge of the feedback signal is detected by the PFD 12, even though the feedback signal is running much slower than the reference signal. When the DOWN signal is asserted, it very soon thereafter de-asserts, thereby causing the UP signal to also de-assert to clear the PFD 12—this is standard PFD 12 operation. When the UP signal de-asserts high, transistor 50 turns off, and interrupts the charging of the LPF 16 from the kick control circuitry 28, albeit for a very short time. The interruption is of very limited duration because the feedback signal is running very slow at this initial point in the charging process, so a rising reference signal edge is quickly detected again by the PFD 12, thereby re-asserting the UP signal low, and re-establishing the kick control circuitry flow path since transistor 50 is on again. As this charging sequence continues, eventually but relatively rapidly, the capacitors 18 and 22 approach the voltage corresponding to the desired frequency for the feedback signal. Approaching this stage of operation, a rising edge of the feedback signal will be detected by the PFD 12 more frequently per unit time than at the beginning of the charging sequence. Accordingly, per unit time, the DOWN signal will be set and cleared more often, thereby resulting in the more frequent de-assertion of the UP signal. All this really means is that the kick control circuitry charging path will be more frequently interrupted through the turning off of transistor 50 than at the beginning of the charging sequence.

Tying these concepts together, the result is that cycling the transistor 50 on the UP signal results in fewer charging interruptions per unit time at the beginning of a charging sequence than at or near the end of a charging sequence. In other words, the rate of charging from the kick control circuit 28 is higher at the beginning than at the end of a charging sequence. This result is very desirable for the following reason. It was already mentioned that the quantity of charge supplied by the kick control circuit 28 per unit time is much larger than that for the charging pump 14, which simultaneously charges in parallel with the kick control circuit 28. If the kick control circuit 28 charged with such a high rate from the beginning of the charging sequence all the way up to the end of the charging sequence, there would likely be overshoot of the desired potential for the capacitors 18 and 22, resulting in the PLL 10 oscillating excessively about the desired new steady-state frequency for the feedback signal. By first charging relatively rapidly, and then slowing the rate of charge from the kick control circuit 28 to capacitors 18 and 22 as they approach the potential corresponding to the desired output frequency for the feedback signal, PLL 10 will quickly reach the new steady-state frequency without any, or at least without any significant, frequency overshoot.

The operational discussion above for the kick control circuit 28 of PLL 10 covers the discharging and the initiation of rapid, yet controlled, charging of capacitors 18 and 22. The remaining operational discussion covers the controls necessary for securing the kick control charge until prompted for a new change in PLL operational frequency, which again would be initiated by assertion of the RESET signal. In order to terminate the kick control charging sequence, the output of NAND gate 40 must go low; therefore, while the kick control circuit 28 is charging, this output remains high. In order to make the NAND gate 40's output go low and terminate the current kick control charging sequence, all three inputs 66a–c to NAND gate 66 must be high simultaneously. This causes the output of NAND gate 66 to go low, thereby causing the output of NAND gate 38 to go high and the output of NAND gate 40 to go low to terminate the current kick control charging sequence. Recall that at this stage, the RESET signal is de-asserted high, so both inputs to NAND gate 40 would be high, thereby causing its output to go low and turn off the kick control charging sequence.

So, it is necessary to understand when the three inputs 66a–c will simultaneously go high. While the charging pump 14 and the kick control circuit 28 are charging the LPF 16 near the beginning of the charging sequence, the feedback signal is obviously running slower than the reference signal. Accordingly, for a given period of time, the reference signal's rising edge will occur prior to a rising edge for the feedback signal. When the reference signal's rising edge is detected by the PFD 12, the UP signal will be asserted low. Next, the PFD 12 will detect a rising edge of the feedback signal, which is running slower than the reference signal, and assert the DOWN signal low. However, as previously discussed per the normal operation of a PFD like PFD 12, the DOWN signal remains asserted for only a short period of time. That is, when the UP and DOWN signals are both asserted low, the PFD 12 will reset itself causing both signals to de-assert high. Note that when the DOWN signal is asserted low, its inverted signal at the output of inverter 72 goes high.

Recall that assertion of the DOWN signal by the PFD 12 is typically associated with "slowing down" the feedback signal (i.e., having the charge pump 14 remove charge from capacitors 18 and 22). In the discussion of the preceding paragraph, the DOWN signal was asserted low; however, the feedback signal did not need to be slowed down since at that early point in the charging sequence, the feedback signal was still running much slower than the reference signal. The reason that the DOWN signal asserted low was merely due to standard PFD operation well known to those skilled in the art. However, since at this early point in the charging sequence the feedback signal is really running slow, and more charge needs to be added to capacitors 18 and 22, it is desirable to have the kick control circuit 28 ignore this inherent, momentary assertion of the DOWN signal. Note however that the charging pump 14 operates as it normally would in response to the assertion of the DOWN signal.

The kick control circuit 28 "ignores" these inherent, momentary assertions of the DOWN signal by the implementation of the delayed UP signal input on 66a to NAND gate 66. It might somehow be possible during the initial charging sequence to have both the UP signal and the inverted DOWN signal high at the same time, and in the absence of the delayed UP signal input to NAND gate 66, this would prematurely terminate the kick control effect on the charging sequence. However, by including the delayed version (i.e. delayed by inverters 68 and 70) of the UP signal with the UP signal input and the inverted DOWN signal input to NAND gate 66, premature termination of the kick control circuit's contribution to the charging sequence is alluded. In the preferred embodiment, the delay of the UP signal afforded by the two inverters 68 and 70 appears optimum; however, those skilled in the art recognize that other delays may possibly be implemented, if desired. Moreover, there are numerous ways of creating a delay similar in duration, and effect, to that caused by inverters 68 and 70, and those skilled in the art could implement, if desired, any one of these other ways.

Thus, during the initial and middle portions of the charging sequence, the charging pump 14 charges the LPF 16 as it normally does, and the kick control circuit 28 rapidly charges the LPF 16. Moreover, the kick control circuit 28 charges LPF 16 without any interruption to its contribution to the charge caused by momentary assertions of the DOWN signal (i.e., those momentary assertions of the DOWN signal caused by the inherent nature of PFD 12). Since the kick control circuit 28 charges LPF 16 without such interruption caused by the momentary assertions of the DOWN signal, the PLL 10 attains steady-state much quicker than it would without the kick control circuit 28.

At the end of the charging sequence, the capacitors 18 and 22 will have been charged to a potential causing the feedback signal to very slightly exceed the reference signal's frequency. Here then, for a given period of time, the reference signal will lag the feedback signal. Accordingly, the feedback signal leads the reference signal, and when the PFD 12 detects the rising edge of the feedback signal, it will assert low the DOWN signal, thereby causing the inverted version thereof coming from inverter 72 to go high. Meanwhile, since the reference signal's rising edge has not yet been detected by the PFD 12, the UP signal has not yet been asserted low (i.e. it's still high, and so is the delayed version of the UP signal). Thus, the three inputs 66a–c to NAND gate 66 are now simultaneously high. As a result, NAND gate 66 outputs a low signal to NAND gate 38, which outputs a high signal. Then, NAND gate 40's inputs are both high since the RESET signal has been, for some time now, de-asserted. Thus, NAND gate 40 outputs a low signal, and turns off the current kick control charging sequence. In particular, a low output from NAND gate 40 ultimately turns off transistor 48, and transmission gate 52.

As the kick control charging sequence is being secured, as discussed above, the reference signal will eventually go from high to low. This will, per standard PFD operation, bring the UP signal down for a short period of time, and at that point, the PFD 12 resets, thereby simultaneously de-asserting high both the UP and DOWN signals. In response, the inverted DOWN signal coming from inverter 72 will go low, and the output of NAND gate 66 will go high. Note that per the standard operation of the RS latch 36, the output of NAND gate 40 will remain low regardless of the fact that the output of NAND gate 66 has gone high, and NAND gate 40's output will remain low until the RESET signal is re-asserted low in order to initiate another kick control charging sequence. So, while NAND gate 40's output remains low the kick control circuit 28 will not be charging the LPF 16. Rather, at this steady-state stage of operation for the PLL 10, only the charging pump 14 controls the small changes required to keep the PLL 10 in steady-state. However, once a new steady-state frequency is desired of the PLL 10, the PLL's RESET signal will again assert low to initiate another kick control charging sequence, which operates as discussed above.

Although the invention has been particularly shown and described with reference to a preferred embodiment thereof, it will be understood by those skilled in the art that changes in form and detail may be made therein without departing from the spirit and scope of the invention.

What is claimed is:

1. An electronic device comprising, in combination:
   a Phased Lock Loop (PLL) having a charge pump;
   a mixed signal circuit coupled in parallel to said charge pump, said mixed signal circuit comprising:
   a latch coupled to a reset signal wherein said reset signal is for said mixed signal circuit; and
   A NAND gate coupled to an output of said latch.

2. The electronic device of claim 1 wherein said mixed signal circuit further comprises an inverter coupled to said reset signal and said inverter has an output coupled to a pair of MOS transistors.

3. The electronic device of claim 2 wherein said output from said inverter is coupled to a gate junction of each transistor of said pair of MOS transistors, wherein a drain junction of one transistor of said pair of MOS transistors is coupled to a first capacitor in a low pass filter of said PLL, and wherein a drain junction of another transistor of said pair of MOS transistors is coupled to a second capacitor in said low pass filter.

4. The electronic device of claim 1 wherein said mixed signal circuit further includes a pair of serially-connected inverters connected between said output of said latch and an input of said NAND gate.

5. The electronic device of claim 1 wherein said NAND gate has an input coupled to said RESET signal.

6. The electronic device of claim 1 wherein said mixed signal circuit further includes a first MOS transistor having a control input coupled to an output of said NAND gate.

7. The electronic device of claim 6 wherein said mixed signal circuit further includes a second MOS transistor, which is serially-connected with said first MOS transistor, and which has an output coupled to a first node wherein said node corresponds to an input junction of a first capacitor of a low pass filter of said PLL.

8. The electronic device of claim 7 wherein said mixed signal circuit further includes a transmission gate coupled between said first node and a second node corresponding to an input junction of a second capacitor of said low pass filter.

9. The electronic device of claim 8 wherein a delayed version of said output from said latch is input to said transmission gate.

10. The electronic device of claim 1 wherein said mixed signal circuit further includes a digital filter having an output coupled as an input to said latch.

11. The electronic device of claim 10 wherein said digital filter includes a NAND gate having its output coupled as an input to said latch.

12. The electronic device of claim 11 wherein said NAND gate has a plurality of inputs including a first input coupled to an UP signal from a Phase Frequency Detector (PFD) of said phase-locked loop, a second input coupled to a delayed version of said UP signal, and a third input coupled to an inverted version of a signal DOWN from said PFD.

13. The electronic device of claim 12 wherein said digital filter includes at least one inverter between said UP signal and said delayed version thereof supplied to said second input.

14. The electronic device of claim 7 wherein a control input of said second MOS transistor is provided with an UP signal from a Phase Frequency Detector (PFD) of said PLL.

15. A method for changing a steady-state operational frequency and rapidly attaining a new steady-state operational frequency for a Phased Lock Loop (PLL) comprising the steps of:
   discharging capacitors of a Low Pass Filter (LPF) of said PLL in response to detection of an assertion of a RESET signal for said PLL;
   turning on a transmission gate in order to permit rapid charging of each capacitor in said LPF, after said step of discharging; and
   charging said capacitors, free from any interruption in charging caused by a DOWN signal coming from a Phase Frequency Detector (PFD) in said PLL, until said capacitors attain a potential substantially corresponding to said new steady-state operational frequency.

16. The method of claim 15 further comprising the steps of:
   monitoring each of an inverted version of said DOWN signal, an UP signal from said PFD, and a delayed version of said UP signal; and
   terminating said step of charging when said inverted version of said DOWN signal, said UP signal, and said delayed version of said UP signal are all at a high logic level.

* * * * *